(12) United States Patent
MacFarlane (10) Patent No.: US 7,982,126 B2
(45) Date of Patent: Jul. 19, 2011

(54) PHOTOVOLTAIC MODULE WITH IMPROVED HEAT TRANSFER AND RECOVERY POTENTIAL

(76) Inventor: Alexander T. MacFarlane, Long Island City, NY (US)

( * ) Notice: Subject to any disclaimer, the term of this patent is extended or adjusted under 35 U.S.C. 154(b) by 402 days.

(21) Appl. No.: 12/124,596

(22) Filed: May 21, 2008

(65) Prior Publication Data

US 2008/0289680 A1 Nov. 27, 2008

Related U.S. Application Data

(60) Provisional application No. 60/930,980, filed on May 21, 2007.

(51) Int. Cl.
*H01L 31/042* (2006.01)
*H01L 21/00* (2006.01)
*H02N 6/00* (2006.01)

(52) U.S. Cl. ............. 136/246; 136/251; 438/66; 438/73

(58) Field of Classification Search .................. 136/246, 136/251; 438/66, 73
See application file for complete search history.

(56) References Cited

U.S. PATENT DOCUMENTS

| 4,316,763 | A | * | 2/1982 | Jensen | 156/513 |
| 4,726,849 | A | * | 2/1988 | Murata et al. | 136/244 |
| 5,437,750 | A | * | 8/1995 | Rinse et al. | 156/73.1 |
| 5,776,262 | A | * | 7/1998 | Melchior | 136/251 |
| 6,051,774 | A | * | 4/2000 | Yoshida et al. | 136/244 |

* cited by examiner

*Primary Examiner* — Basia Ridley
*Assistant Examiner* — Tamir Ayad
(74) *Attorney, Agent, or Firm* — Pryor Cashman LLP; Barry E. Negrin, Esq.

(57) ABSTRACT

A photovoltaic module with improved thermal properties, a method of making same and a structural, thermally improved photovoltaic panel are provided. A plurality of perforations are formed substantially entirely through the module which form a ventilation mechanism allowing heat to be transferred from the front side of the module to the rear side of the module. The perforations may be formed at a number of different stages in the manufacture of the module. Tubular reinforcements such as eyelets may be placed within the holes, preferably when the encapsulating material is only partially cured. The photovoltaic module may be attached to a structural and thermally conductive substrate, with sufficient strength for module to be utilized as stand-alone panel or building-integrated façade panel, simultaneously containing a large heat exchange surface area and provision for turbulent air flow.

19 Claims, 10 Drawing Sheets

*Prior Art*

PHOTOVOLTAIC MODULE WITH IMPROVED HEAT TRANSFER AND RECOVERY POTENTIAL

RELATED APPLICATIONS

Domestic priority is claimed from U.S. Provisional Patent Application No. 60/930,980 filed May 21, 2007, entitled "Method of Perforating Photovoltaic Thin-Film Modules for Improved Convective Heat Transfer and Heat Recovery from Panel Surfaces", the teachings of which are entirely incorporated by reference herein.

BACKGROUND OF THE INVENTION

1. Field of the Invention

The present invention relates to photovoltaic (PV) modules and film laminates, and more particularly to PV modules and film laminates having improved heat transfer characteristics and employing a mechanism for utilizing heat absorbed by the module via solar radiation.

2. Description of the Prior Art

Simultaneous collection of electricity and heat from a solar panel has been attempted in a variety of configurations.

Individual solar photovoltaic modules of varying type have been attached to transpired, hot air solar collectors such as that described in U.S. Pat. Nos. 4,934,338 and 6,870,087. Also, heat has been collected from behind photovoltaic curtainwall assemblies, such as the library at Mataro, Spain.

Although it is known in the industry that high module temperatures can inhibit electrical output and that the majority (80-95%) of absorbed solar energy to the module is re-emitted as heat, few attempts have been made to improve the thermal performance of solar photovoltaic modules themselves for collection of waste heat.

Many methods have been created to alter photovoltaic modules to exhibit other desired properties, such as transparency or different colors. Several methods exist for allowing thin-film photovoltaic modules to exhibit a certain degree of transparency. These methods involve etching, scribing or scoring layers away to reveal "windows" in the module.

Solar cells exist with "through-holes" for the purpose of providing a conductive pathway from the front electrode to the backside electrode, such as U.S. Pat. No. 3,903,427 and U.S. patent application Ser. No. 11/278,645. Interconnection of cell electrodes established via conductive through-holes eliminates the need for extensive conductive grid busses, reduces shading effect therefrom, reduces deleted area for scribe lines and allows for larger individual cells. Such solar cell through-holes are not formed entirely through the solar module from front to back. Indeed, owing to moisture concerns (specifically, keeping moisture out of the inner portions of a PV module), one would never form a hole entirely through a PV module in a conventional module.

Further, while several module framing and mounting methods are designed to improve heat transfer from a typical photovoltaic panel, few if any panel constructions are designed with the express purpose (among others) of increasing and improving heat transfer to the rear of the photovoltaic module.

For the purposes of the present disclosure, a method of forming a typical thin-film photovoltaic solar module such as that disclosed in U.S. Pat. No. 4,315,096 (and improved over the years) can be simplified as:

1) Deposition of conducting layer upon electrically-insulating substrate;
2) Longitudinal scribing of conducting layer (via chemical or mechanical etch, or laser) to establish isolation of individual cell units in a "first scribe";
3) Deposition of semi-conducting thin film active layers (e.g. p-i-n single junction);
4) Longitudinal scribing of semi-conducting thin film layers), while keeping underlaying conductive layer intact, in a "second scribe";
5) Deposition of transparent conductive oxide (TCO) front contact layer;
6) Longitudinal scribing of front contact layer and semi-conducting thin film active layer, while keeping underlaying conductive layer intact, to establish serial connection between individual cells in a "third scribe";
7) Optional placement of conductive grid of busses atop TCO layer to assist in carrying current;
8) Placement of encapsulant sealing material (e.g. ethylene vinyl acetate (EVA), Polyvinylbutyral (PVB) thermoplastic resin or 2-part epoxy).
9) Placement of transparent frontsheet (e.g. glass or plastic) and module encapsulation (using e.g. vacuum press).

Typical intermediate or following steps include placing of wiring terminals, testing of module electrical output and final panel packaging and framing.

For superstrate deposition the process is similar, where the largest difference is that thin film deposition occurs on the front coversheet and contact materials, and final encapsulation includes the rear protective layers (e.g. encapsulant materials and glass or plastic rearsheet).

Proper encapsulation of the module is necessary to ensure protection of the solar cells from exposure to the elements. Protection from moisture ingress, physical impact, and dirt are primary concerns to the long-term functioning of the PV cell.

SUMMARY OF THE INVENTION

An object of the present invention is to allow for efficient rejection of waste heat from a solar photovoltaic module and collection of said waste heat. This is achieved via a plurality of perforations through the module and a thermally conductive module construction. Thermal boundary layers of air are allowed to pass from the external front-side of the module to the external rear-side. In this way, convective heat losses may be recovered, collected and utilized and rear-panel cavity overheating is avoided.

In one embodiment of the invention, the invention is a photovoltaic module having a front side and a rear side, and including an insulating substrate. At least one photovoltaic solar cell layer includes at least one conducting electrode layer deposited on the insulating substrate, at least one semi-conducting active layer deposited on the at least one conducting layer, and at least one front conducting electrode layer deposited on the at least one semi-conducting active layer and the at least one conducting layer. At least one layer of photovoltaic cell protective encapsulant and at least one transparent front-sheet are provided. A plurality of perforations are formed substantially entirely through the module from the front side to the rear side forming a ventilation mechanism allowing heat to be transferred from the front side of the module to the rear side of the module.

Preferably, the inventive module includes a plurality of substantially tubular reinforcements disposed respectively within each of the perforations. The tubular reinforcements are preferably plastic, electrically insulating eyelets, grommets, or the like. The tubular reinforcements may serve as additional mechanical attachment to a rear structural thermally conductive substrate which, in turn, has a second set of perforations at least through a contact surface between the substrate and the module. The second set of perforations in the structural substrate preferably substantially correspond to the perforations in the module. The surface area of the perforations is preferably less than 5% of a surface area of the module, and more preferably between 0.5-1.5% thereof. The diameter of each of the perforations is preferably less than 3 millimeters.

The invention also includes a method of manufacturing a photovoltaic module. At least one un-encapsulated solar photovoltaic cell is created, containing at least one insulating substrate layer, one electrode layer and one semi-conducting layer. The cell is encapsulated with at least one of thermoset resin or epoxy encapsulant and protective frontsheet. A ventilation mechanism is formed allowing heat to be transferred convectively from one side of the module to the other side of the module by forming a plurality of perforations substantially entirely through the module from one side to the other side.

The method preferably also includes the step of forming perforation site voids each having a diameter greater than that of the ultimate module perforations, prior to module encapsulation. The perforation site void forming step, where necessary, further includes at least one of the following: scribing, etching, grooving mechanical grinding, polishing, or chemical etching.

Module perforation is preferably formed directly through only the insulating substrate, encapsulant and frontsheet layers, avoiding direct penetration of the conducting electrode layers or semi-conducting active layers (which may have already been removed in the creation of the perforation site void), One embodiment includes formation of the perforation directly through the core of a solar cell through-hole conducting connection, however this step is preferably followed by insulation and protection of said conducting connection such that said conducting connection does not remain exposed to the core of the perforation.

Preferably, the inventive method includes the step of forming a second set of perforations in a rear structural substrate that substantially correspond to the module perforations, where said second set of perforation may be rear panel inlets.

It is preferred that the perforation forming step is performed prior to complete module encapsulant curing. Tubular reinforcements may be added to each of the perforations formed in the module, preferably also prior to complete module encapsulant curing.

The invention also includes a structural, thermally optimized photovoltaic panel, having a thermally conductive structural panel having a plurality of panel inlets and outlets; a photovoltaic module, having a first side exposable to the environment and a second side attached to the panel, containing a plurality of perforations formed substantially entirely through said module, where said perforations correspond to said panel inlets and heat may be transferred directly to said structural panel via conduction and via convection in said ventilation mechanism and then said heat may be transferred from the panel overall to an airstream at the rear of said panel via said panel outlets, and rear panel conductive surfaces.

The structural panel preferably includes aluminum honeycomb paneling, and the structural panel is preferably adhered to the photovoltaic module with thermally conductive adhesive. The panel is preferably integrated as a building construction element. In this embodiment, heat transferred from the first side to the second side into a heated air stream is usable as pre-heated ventilation air, for relief of cavity overheating, to create buoyant chimney effect, to recharge dehumidification desiccant, and/or to pre-heat hot water via air-to-water coils for the building upon which the panel is disposed.

In a more general embodiment, the invention is a photovoltaic module having a first side and a second side containing a plurality of perforations formed substantially entirely through the module forming a ventilation mechanism allowing heat to be transferred convectively from the first side of the module to the second side of the module.

Module temperatures may also be regulated more effectively, thereby cooling photovoltaic cells. Recovered heat can be valuable for a multitude of uses, and can help to reduce the payback period of conventional photovoltaic modules, particularly in heating-season dominated climes. Further, the long-term decline in photovoltaic electrical output typical of modules and panels known in the art can be offset by having thermally improved modules and panels maintain a useful role, in that heat is still collected. Provided declines in electrical output are a function of cell degradation and not a decrease in overall panel absorptivity, said decline in electrical output will correspond to an increase in collected heat.

Several inventive methods for achieving the perforations are described below.

The invention describes an alteration to typical thin-film photovoltaic solar module manufacturing methods which can be simplified as:

1) Deposition of rear contact coating on insulating substrate or in the case of superstrate construction, deposition of transparent conducting layer upon transparent insulating superstrate (e.g. glass or plastic);
2) Longitudinal scribing of conducting layer (usually with laser) to establish isolation of individual cell units in a "first scribe";
3) Deposition of semi-conducting active layers (e.g. p-i-n single junction);
4) Longitudinal scribing of semi-conducting active layers (usually with laser), while keeping under-laying conductive layer intact, in a "second scribe";
5) Deposition of front transparent conducting layer, or in the case of superstrate construction, deposition of the rear contact layer;
6) Longitudinal scribing of contact layer and active layer, while keeping under-laying conductive layer intact, to establish serial connection between individual cells in a "third scribe";
7) Formation of "perforation void sites", where semiconductor active layers and conducting layers are removed in scribing, etching or grooving by means used in forming serial interconnected bands, or by separate means un-related to the PV film formation (such as mechanical grinding/polishing, or chemical etching) or a combination of both means (wherein thin film scribing laser etches hole site outline pattern followed by removal of perforation site "fill" by separate means). In most cases, perforation patterns are established prior to deposition of encapsulant material and panel.
8) Encapsulant is laid over all layers and voids, completely filling the perforation sites while forming cylindrical plugs.
9) Placement of frontsheet, or in the case of superstrate construction placement of protective rear covering or backsheet, followed by final module encapsulation (using e.g. heated vacuum press). In some cases, the encapsulant adhesive material will be applied to the protective backsheet or frontsheet covering prior to placement of both onto PV film. As many encapsulants are a type of thermoset resin, and as the encapsulation step will require adhesive to flow and completely fill perforation sites, the application of heat to the module during encapsulation is a common requirement.

10) Drilling or punching of module perforation at preformed perforation void sites through cylindrical encapsulant, glue or electrode plug in a diameter smaller than the plug itself; such that the core and wall of the plug establish a primary weather-barrier and seal, or location for further weatherproofing.

11) Optional placement and setting of eyelet or grommet through perforation as secondary weather-seal and protection of the encapsulant plug and/or mechanical fastening of module frontsheet materials to module rearsheet materials and/or other external supporting construction while allowing air flow through core of eyelet or grommet.

12) Typical intermediate or following steps include placing of wiring terminals, testing of module electrical output and final module packaging and framing to form panel.

BRIEF DESCRIPTION OF THE DRAWINGS

FIGS. 3 A-D show the SECOND embodiment of the inventive method of creating a thermally improved module, where the sequence of manufacturing and hole drilling are shown in section in FIG. 3a through FIG. 3b, corresponding to section "u", and in plan view in FIGS. 3C and 3D.

The arrow labeled "L" indicates the general direction of incoming solar radiation for all Figures.

DETAILED DESCRIPTION OF THE DRAWINGS AND INVENTION

The inventive method is now described with reference to the appended FIGS. 1-10. It should be understood that these figures are exemplary in nature and in no way serve to limit the scope of the invention which is defined by the claims appearing hereinbelow.

It is understood that in the following description, the term "solar photovoltaic cell" refers to a functioning device known in the art for useful conversion of solar radiation into electricity, where said device has yet to be encapsulated or otherwise protected from the elements, the term "solar photovoltaic module" consists of at least one solar photovoltaic cell in an encapsulated state, and "solar photovoltaic panel" consists of at least one solar photovoltaic module in a state sufficient for mounting and use, e.g. where said panel is framed, provided with exterior wiring harness etc. The term "structural" refers only to the ability of a described element to support itself against normal forces experienced in outdoor application, and does not refer to the ability of a described element to support other elements not described herein.

Further, the drawings illustrate the process as applied to a substrate construction, in which the active layers are deposited on the rear insulating material. This inventive process and all embodiments would likewise apply to a superstrate construction in which the active layers are deposited on the front transparent covering or electrodes, with little alteration of the inventive process described herein being necessary.

Figure 1A:
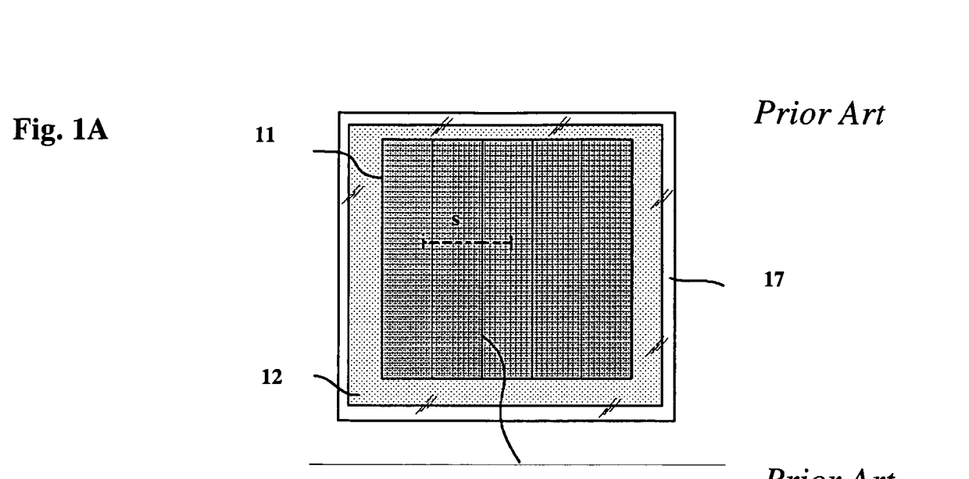
FIG. 1a is a plan view of a prior art thin film module consisting of multiple cells.

FIG. 1a is a plan view of a typical thin film module consisting of multiple cells, where solar photovoltaic cell layers 11, or interconnected string of cells, comprised of at least one front electrode, one active layer, one rear electrode and associated wiring and terminals on rear substrate 12 comprised of at least one electrically insulating layer, which may serve as deposition substrate for solar cell layers, and may also serve as the rear protective coversheet. Common rear substrate materials include plastic films such as polyethylene terephthalate (PET), polyvinyl fluoride (PVF), polyimide (e.g. DuPont Kapton), PCTFE (e.g. Honeywell Aclar) plastic-metal-plastic film assemblies such as PVF-Aluminum (Al)-PVF and glass. Photovoltaic cell layers 11 are segmented into solar cell interconnection 20, wherein individual solar cells are separated from one another by breaks or scribes in front electrode, active layers and/or rear electrode.

Figure 1B:
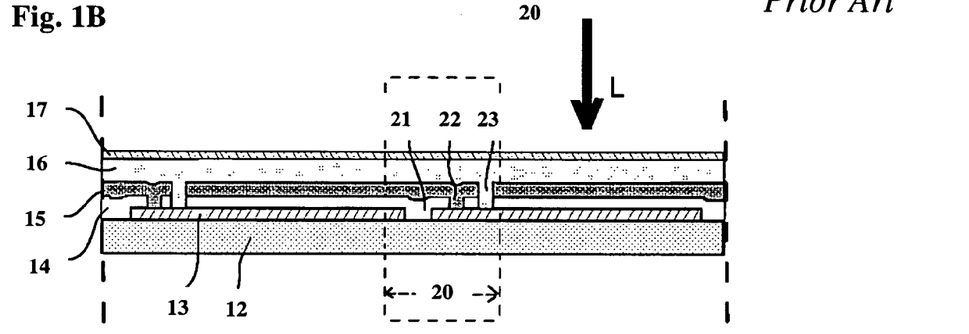
FIG. 1b is a section of the same module across section "s".

FIG. 1b is a section of the same module across section "s" where rear electrode 13 of photovoltaic cell, which may consist of at least one conductive layer vacuum deposited on insulating rear substrate 12 or may consist of a thin layer of metal film, of for example, aluminum, copper or stainless steel foil or may consist of metallic paste contact circuits printed upon rear substrate 12, followed by active layer 14 of photovoltaic cell, consisting of at least one positively-doped semiconductive layer (P) and one negatively-doped semiconductive layer (N) and possibly intermediate layers (I), where semiconductor materials may consist of doped amorphous Silicon (a-Si), copper indium diselenide (GIGS), or cadmium telluride (CdTe), inclusive of all common deposition methods. In addition active layer may consist of grown crystalline Silicon (c-Si), polycrystalline Silicon (poly-Si) or third-generation "printed" nano-structured solar inks. Atop active layer 14 are often placed in this order:

transparent front electrode 15, normally formed from deposited layers of transparent conductive oxide such as Zinc or Tin oxides, and may or may not include highly conductive grid of for example printed metal paste contacts, to increase overall electrical conductivity, module encapsulant 16, consisting of a highly transparent, electrically insulating thermoset resin such as ethyl vinyl acetate (EVA) or polyvinyl butyryl (PVB), or moisture permeation resistant epoxy resin such as bisphenol-A cured with polyamine, polyamide, amidoamine, or cycloaliphatic amines inclusive of all modified versions of these resins and other common solar module encapsulants, and;

transparent front coversheet 17 consisting of at least one highly transparent layer of plastic or glass. Plastic coversheets are inclusive of, for example, fluoroplastic films often modified for improved adhesion with for example corona discharge, of polychlorotrifluoroethlyene (PCTFE), ethylene chlorotrifluoroethlyene (ECTFE), ethylene tetrafluoroethylene (ETFE), fluorinated ethylene propylene (FEP), polytetrafluoroethylene (PTFE), and/or other low-haze, optically clear, moisture permeation resistant barrier plastic films, preferably with long-term opacity in the ultraviolet (UV) spectrum, light-trapping surface geometry, and of thickness between 20 and 500 microns. Transparent front coversheet must be durable, impact resistant, remain transparent over decades of solar exposure and serve to protect encapsulant and photovoltaic layers.

Solar cell interconnection 20 is formed by first scribe 21 of rear electrode layer (either ablation via mechanical etch, chemical etch or laser) to establish isolation of individual cell units. Can also be pre-formed by selective printing of rear electrode layers to allow voids or by selective deposition or adhesion to rear substrate to allow voids;

Second scribe of active layer(s) 22 (either ablation via mechanical etch, chemical etch or laser) to establish break in active layers, allowing front electrode applied to active layer in following steps to pass current to rear electrode. Can also be pre-formed by selective printing of active layers to allow voids or by selective deposition or adhesion to rear electrode to allow voids.

Third scribe 23 of front electrode layer and active layer (either ablation via mechanical etch, chemical etch or laser) to establish final isolation of individual cell units. Can also be pre-formed by selective printing of front electrode layer and active layer to allow voids or by selective deposition or adhesion to allow voids.

Figure 2A:
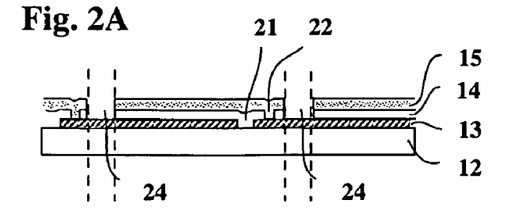
FIG. 2a-h show the FIRST embodiment of the inventive method of creating a thermally improved module, where the sequence of manufacturing and hole drilling are shown in FIG. 2a through FIG. 2d corresponding to section "t", and in plan view in FIG. 2e through 2h.
Figure 2B:
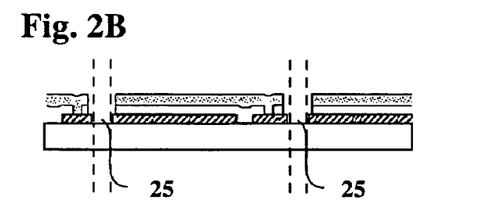
Figure 2C:
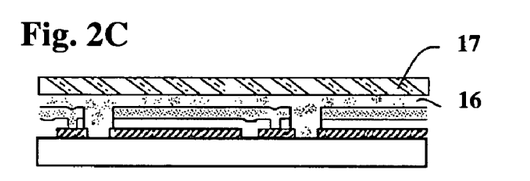
Figure 2D:
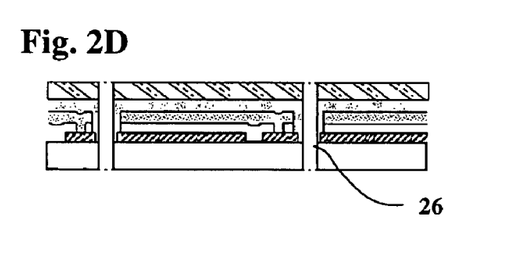
Figure 2E:
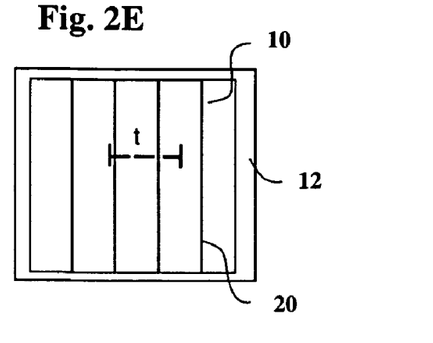
Figures 2F, 2G:
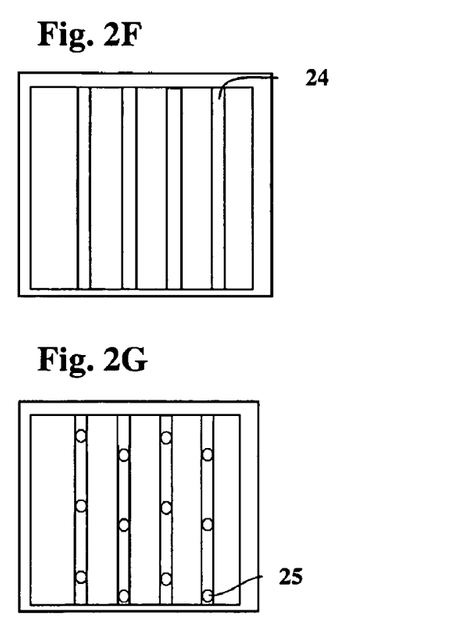
Figure 2H:
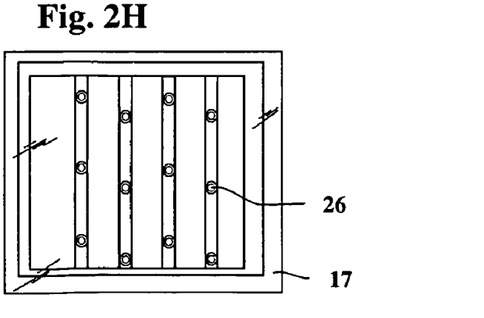
Figure 3A:
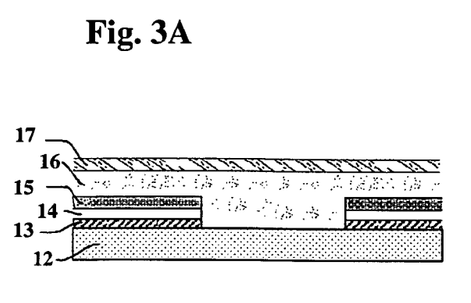
Figure 3B:
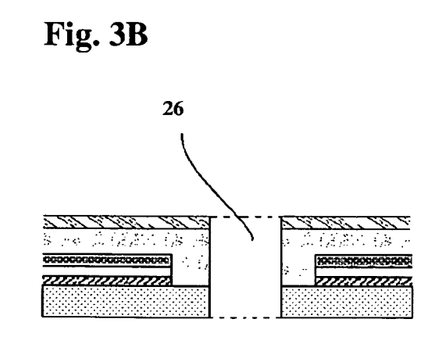
Figure 3C:
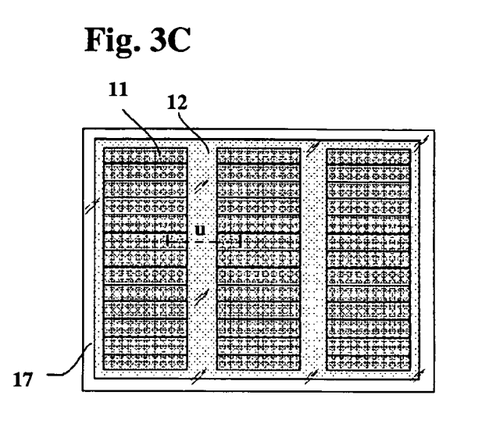
Figure 3D:
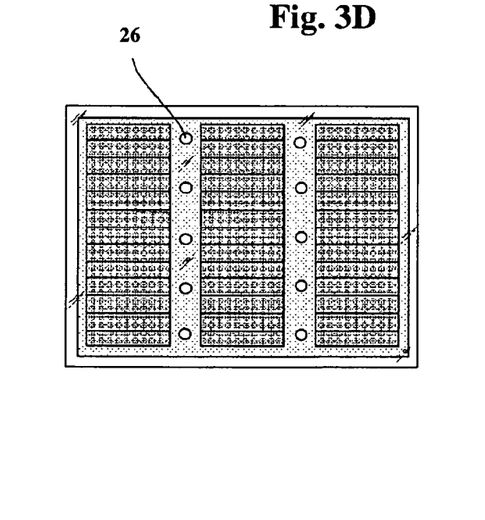

FIG. 2a-h shows the first embodiment of the inventive method of creating a ventilated module, where following the second scribe 22 a trench 24, larger in width than typical third scribe, through front electrode layer and active layer (either ablation via mechanical etch, chemical etch or laser), reveals rear electrode 13. The trench can also be pre-formed by patterning front electrode layer and active layer to allow voids using, for example selective printing, deposition or adhesion methods (shown in FIGS. 2a and 2f). Rear electrode 13 contains rear electrode perforation site void 25 of diameter preferably 0.5-5 millimeters larger than final perforation diameter, formed through at least one electrode layer of photovoltaic cell via mechanical or chemical etch, ablative laser or pre-formed by selective printing of electrode to allow perforation site void or by selective deposition or adhesion to allow perforation site void. May be formed by multiple steps, where for example, outline of perforation site void is formed with ablative laser and bulk of electrode layer material is later removed via mechanical grinding. Atop all layers shown in FIG. 2b is encapsulant 16 and transparent front coversheet 17. FIG. 2d shows perforation 26, preferably of diameter less than 3.0 millimeters formed through all layers of solar module, established concurrent with, or immediately following, module encapsulation by waterjet, laser or mechanical drilling or by punch. Total module void area formed by plurality of evenly spaced perforations is preferably equal to 0.5-1.5% of total module absorber surface area, including all photovoltaic absorptive surfaces and absorptive surfaces not of photovoltaic cell (e.g. dark finish of rear substrate or structural substrate).

FIG. 3a-d show the SECOND embodiment of the inventive method of creating a ventilated module, where perforations 26 are formed only through rear substrate 12, encapsulant 16 and frontsheet 17.

Figure 4A:
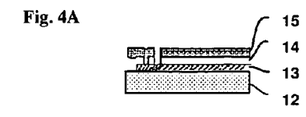
FIG. 4a-i are sectional views of the THIRD embodiment of the inventive method of creating a thermally improved module, where FIG. 4a-4d correspond to section "v" and FIG. 4e-4i correspond to section "w". Alternate layouts of the perforation site patterns are shown in plan view FIGS. 4j and 4k.
Figure 4B:
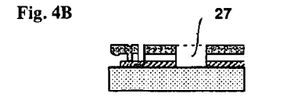
Figure 4C:
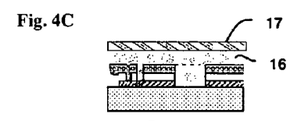
Figure 4D:
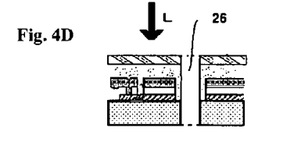
Figure 4E:
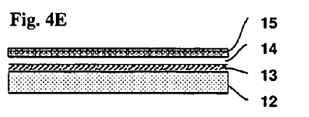
Figure 4F:
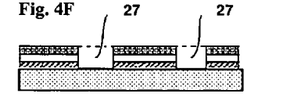
Figure 4G:
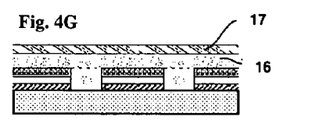
Figure 4H:
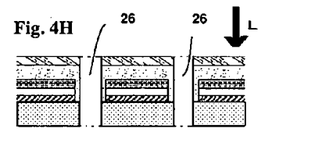
Figure 4I:
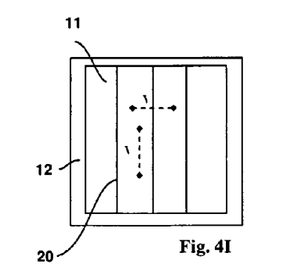
Figure 4J:
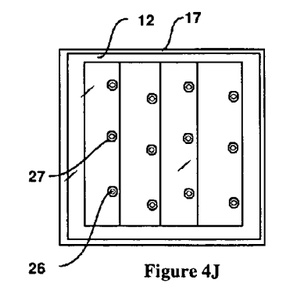
Figure 4K:
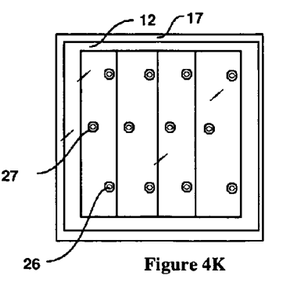

FIG. 4a-h are various views of the THIRD embodiment of the inventive method of creating a ventilated module, where following the third scribe (e.g. 23) layers 13,14 and 15 are removed at the desired multiple layer perforation site void 27 of diameter preferably 0.5-5 millimeters larger than final perforation diameter, formed through at least one electrode or active layer of photovoltaic cell via mechanical or chemical etch, ablative laser or pre-formed by selective printing of electrode and or active layers to allow perforation site void or by selective deposition or adhesion to allow perforation site void. May be formed by multiple steps, where for example, outline of perforation site void is formed with ablative laser and bulk of electrode and/or active layer material is later removed via mechanical etching (shown in FIGS. 4b and 4f). This step is followed by placement of module encapsulant 16 and transparent front coversheet 17, followed by typical encapsulation and formation of perforation 26 (FIGS. 4h and 4i,). FIG. 4j shows a perforation pattern in which perforation void sites are always the same distance from interconnection 20. FIG. 4k shows a perforation pattern in which perforation sites are at varying distance from interconnections 20.

Figure 5A:
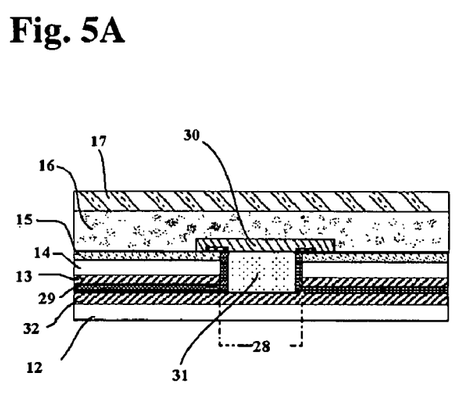
FIG. 5a-b shows a prior art photovoltaic cell, where through-holes form a conductive pathway from the front to rear of the cell.
Figure 5B:
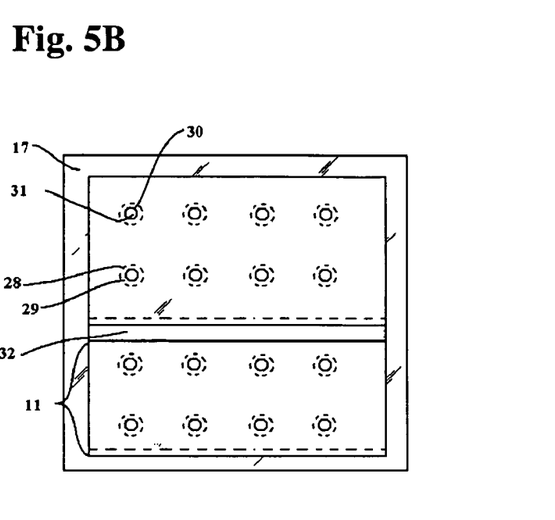

FIG. 5a shows a solar photovoltaic cell disclosed in the prior art, utilizing through-hole conductive pathways. FIGS. 5a and 5b show:

Solar cell through-hole 28, where front electrode or traces 15, active layer 14 and rear electrode 13 are pre-punched or drilled to allow connection of the front electrode or traces 15 to a backside electrode 32;

Through-hole insulation 29, formed with the purpose of electrically isolating front electrode or traces 15, active layer 14 and rear electrode 13 from the conductive connection 31 to backside electrode 32;

Contact bridge 30, connecting front electrode 15 to conductive connection 31;

Conductive connection 31 between contact bridge 30 and backside electrode 32, which may completely fill void remaining after placement of through-hole insulation 29, or may only be of sufficient thickness against through-hole insulation 29 to provide sufficient conductive pathway.

A serial connection from cell 11 to the next cell via backside electrode 32, or extension thereof, to rear electrode 13 of next cell.

A substrate 12, an encapsulant 16 and front-sheet 17.

Figure 6A:
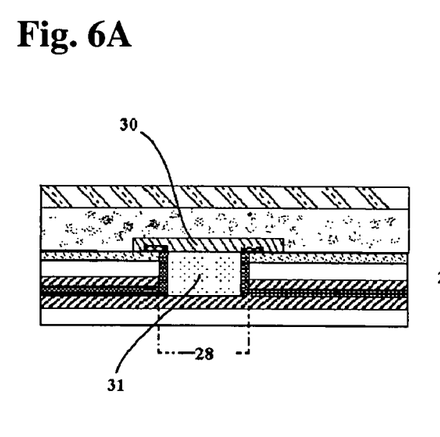
FIG. 6a-d show the FOURTH embodiment of the inventive method of creating a thermally improved module, where FIG. 6a correspond to section "x" of plan view 6c and FIG. 6b corresponds to section "y" of FIG. 6d.
Figure 6B:
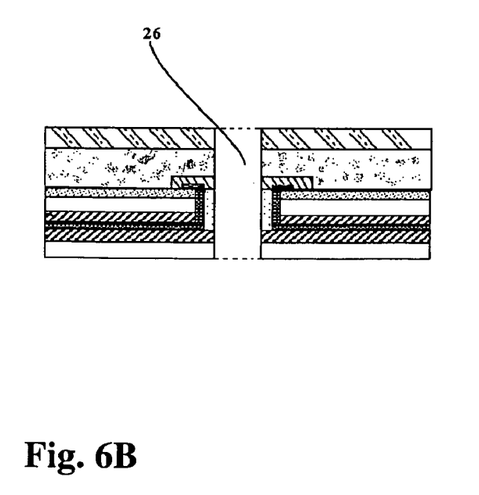
Figure 6C:
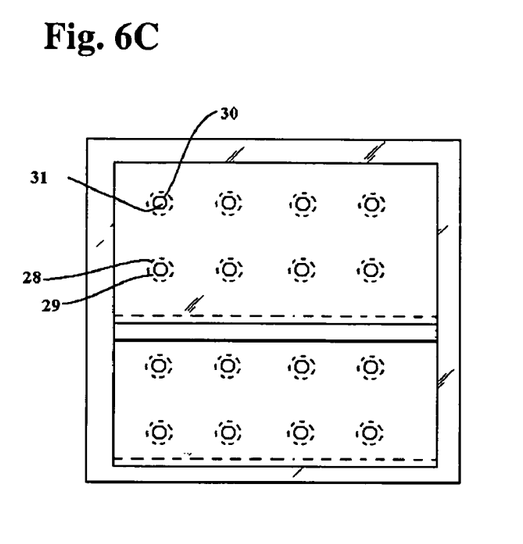
Figure 6D:
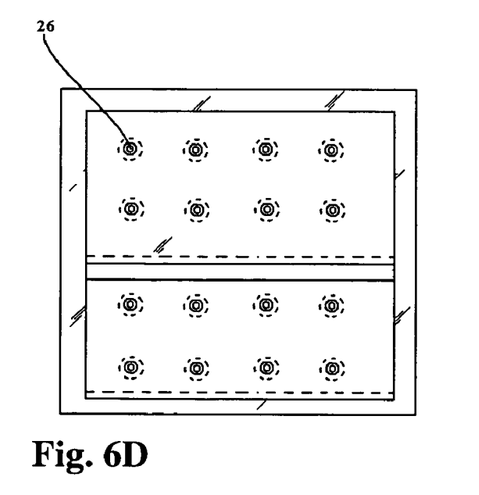

FIG. 6a-6d show a FOURTH embodiment of the inventive method for formation of perforation and ventilated module wherein;

FIGS. 6a and 6c show a solar photovoltaic cell and module utilizing through-hole conductive pathways, similar to that described in FIG. 5, with the exception that:

Diameter of through-hole 28 is preferably 0.1-5.0 millimeters larger in diameter than later perforation 26, and;

FIGS. 6b and 6d show perforation 26 formed through core of conductive connection 31.

Figure 7A:
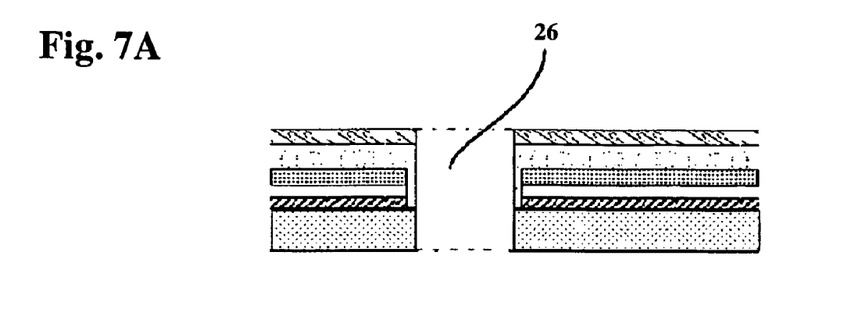
FIG. 7a-c show placement of an eyelet through perforation sites, potentially incorporating inventive methods described herein.
Figure 7B:
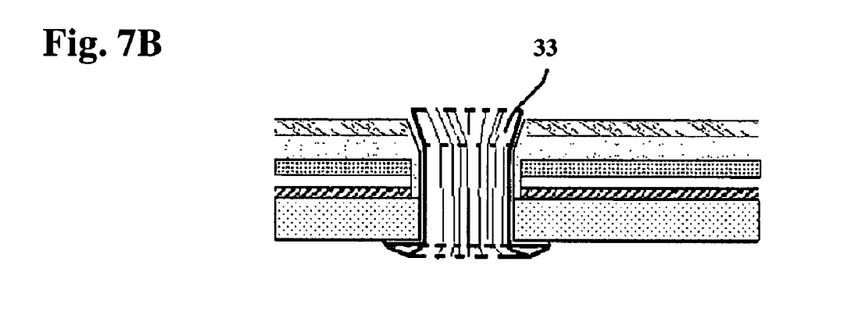
Figure 7C:
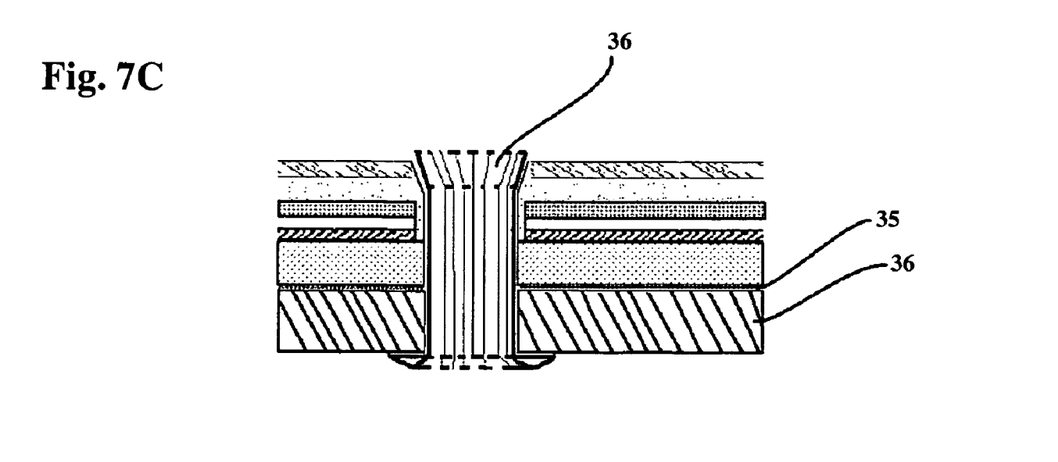

FIGS. 7a-7c show the addition of a protective eyelet to the perforation 26 and addition of a structural substrate to the module construction, potentially useful in all inventive methods of forming perforation disclosed herein. FIG. 7B shows:

Perforation eyelet 33, preferably having funnel flange oriented to module frontside and preferably constructed of durable electrically insulating plastic, that forms an additional protective layer for perforation and extends through all layers of solar module. May be installed in same step as formation of perforation 26, for example, in the case of mechanical punching.

FIG. 7c shows:

Structural, thermally conductive substrate 34 installed concurrent with module encapsulation and perforated along with module, imparting strength to solar module, sufficient for the module to be used as for example a building façade panel, and preferably constructed of thermally conductive material such as aluminum honeycomb paneling;

Thermally conductive adhesive 35;

Attachment perforation eyelet 36, that extends through module and substrate 34, and when set, forms a mechanical attachment between module and structural, thermally conductive substrate as well as protection for perforation 26.

Figure 8:
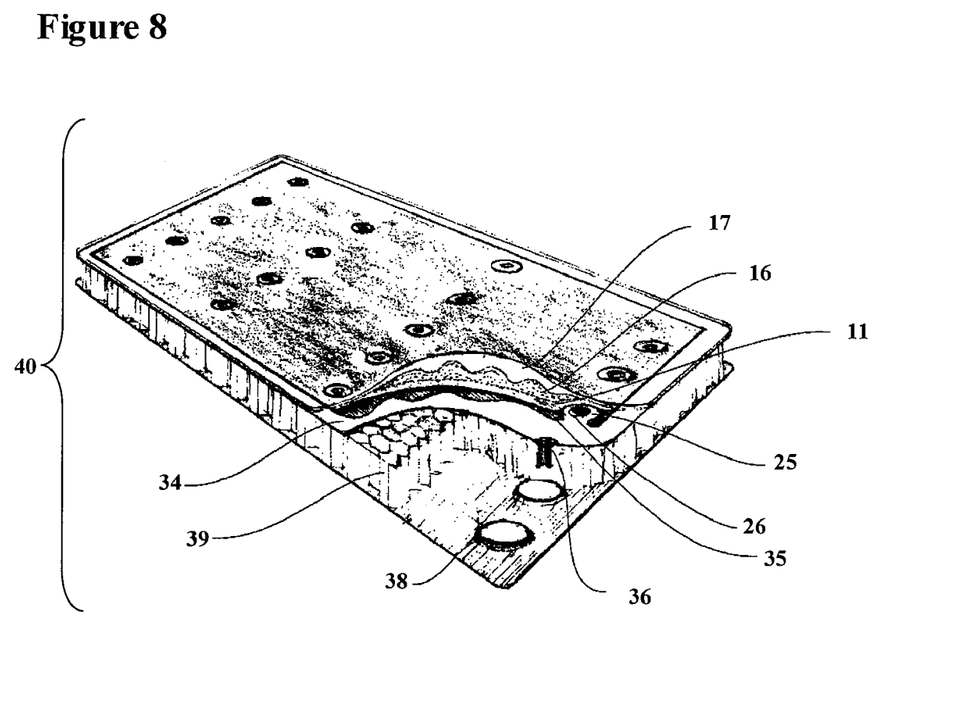
FIG. 8 shows a perspective view of an example of a structural, thermally optimized photovoltaic panel, potentially incorporating inventive methods described herein.

FIG. 8 is a perspective view of an entire structural, thermally optimized photovoltaic panel 40, with the added elements of:

Substrate panel outlet 38 located directly rear to module perforation where total void area formed by plurality of substrate panel holes is preferably equal to between 5-15% of rear surface area. Substrate panel outlet is preferably formed prior to attachment of module to substrate, allowing access of tooling to perforation site from the rear. Panel outlet also serves to assist in creating a turbulent flow in heated airstream, thereby improving heat transfer, and;

Aluminum honeycomb matrix 39.

Figure 9:
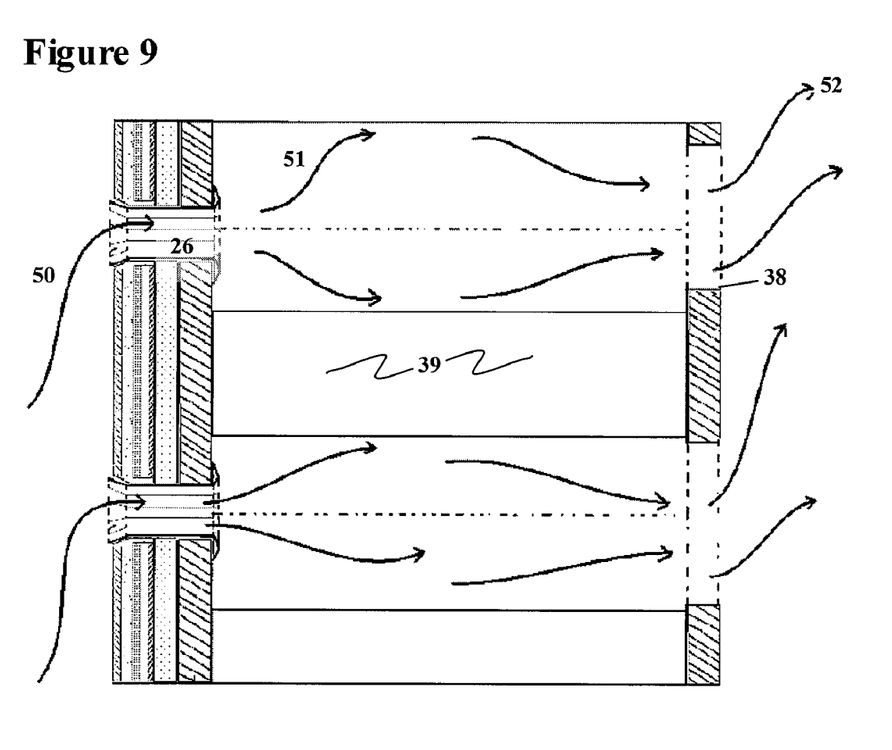
FIG. 9 shows a sectional view of an example of a structural, thermally optimized photovoltaic panel, potentially incorporating inventive methods described herein.

FIG. 9 shows a cross section of panel 40 where:

Front panel boundary layer inlet airstream 50, is allowed to pass through perforation 26;

Interior panel airstream 51 moves through and becomes further heated by, aluminum honeycomb matrix 39, and;

Panel outlet airstream 52 exits the panel via substrate panel outlet 38.

Figure 10:
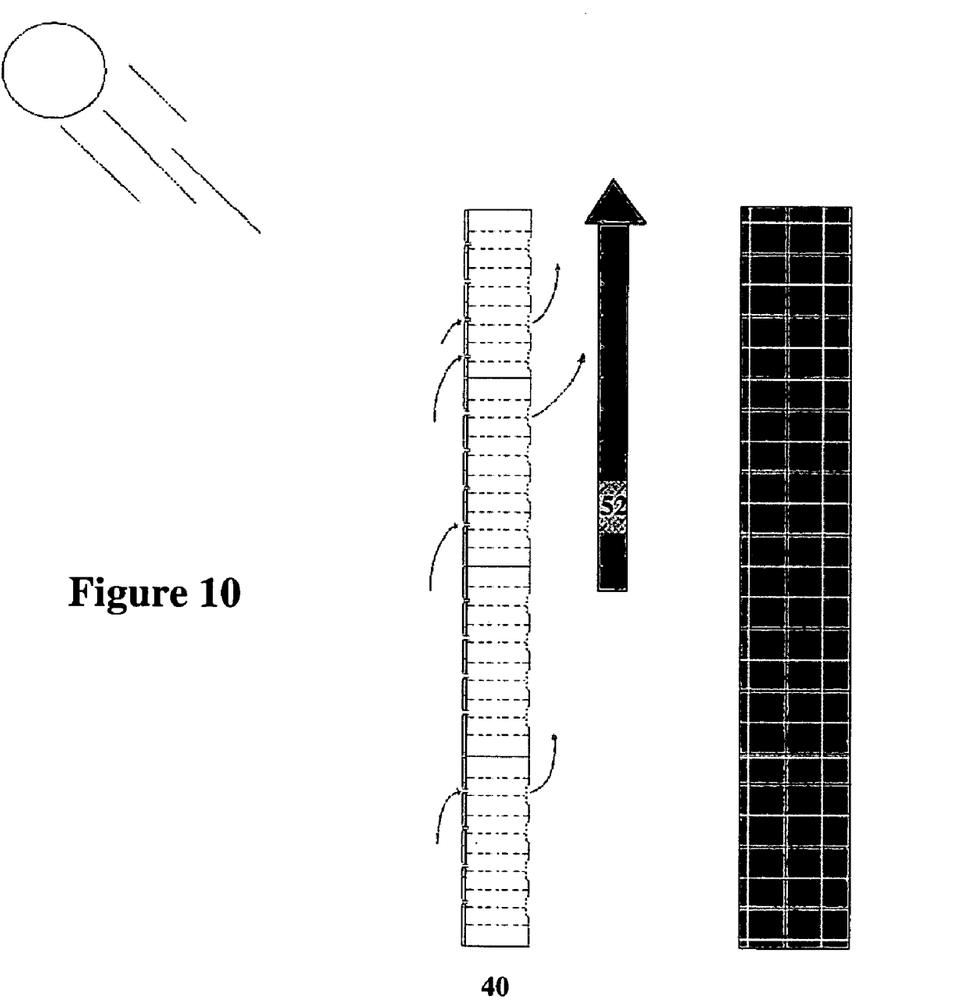
FIG. 10 shows a sectional view of structural, thermally optimized photovoltaic panel used in a building integrated or dedicated heat collection application, potentially incorporating inventive methods described herein.

FIG. 10 shows a cross section of panel 40 applied to heat captive airstream 52. The captive airstream exists at the rear of the panel, when the panel is attached to, for example, a solid building wall, roof or duct, creating a cavity. Heat rejected from the photovoltaic panel surfaces may be transferred to said captive airstream via ventilation mechanism and direct conduction described herein.

Formation of the Perforations

It is well understood that outdoor weather and real-world conditions represent the greatest threats to long term survivability of a solar photovoltaic module. Solar modules are frequently offered with guarantees against electricity output degradation, hazing, de-laminating, and the like. The idea of purposefully perforating said panels, would therefore, seem counter-productive to the goal of long-term survivability. Grommets are sometimes punched through flexible thin-film modules, as in the case of portable battery chargers, however, the distance from module edges to active layers in these modules is significant in order to prevent moisture migration through encapsulant.

It is moisture that poses the major liability associated with module perforation. An encapsulant 16 with very low water vapor transmission rate (WVTR) may be required in addition to barrier films present in frontsheet 17. Of particular concern would be the few cubic millimeters of encapsulant surrounding the perforations 26. Several solutions may address this potential area of concern, notably:

Use of insulating eyelet 33 with at least one eyelet material having a WVTR equal to or lower than the frontsheet 17, and potentially welded to exterior side of frontsheet 17;

Use of very low WVTR non-yellowing encapsulant 16 such as bisphenol-a/cycloaliphatic amine epoxy;

Use of highly adsorptive nanometer-sized crystalline particles suspended in encapsulant 16 for the purpose of binding water vapor, and;

Welding of frontsheet 17 directly to rear substrate 13 at perforation void sites 27 prior or concurrent with placement of insulating eyelet 33, or;

Any combination of the above described solutions.

The overall goal of the through module perforation is to collect the thermal boundary layer in front of the panel and relieve panel cavity overheating. This can be accomplished effectively with a surprisingly small perforation area; around 1% is typically sufficient to observe significant improvements in panel heat recovery efficiency.

To correctly form the module perforation, encapsulant should be sufficiently set to prevent uncontrolled adhesive flow. In the case of sheet applied adhesive like EVA, the perforation and perforation eyelet may be formed and set prior to any heating of EVA as it is structurally stable and will not flow prior to heating. In the case of liquid 2-part epoxy encapsulant, perforation and perforation eyelet should be formed after sufficient set period as specified by epoxy manufacturer. In both cases, it is preferable for final curing to follow perforation and perforation formation and setting. Where perforation eyelets are not used, perforation may follow final curing, although some scenarios could justify setting of eyelet after final curing.

It is preferable that perforations are formed with simple, fast and inexpensive methods such as punch and die. It has been determined by the author that at least in the case of an a-Si module, formation of the perforation is not destructive to electrical output of the module beyond that in proportion to the area removed. In some of the described configurations, electrodes may have to be thickened or otherwise enlarged to overcome excessive resistance potentially created by the lack of deleted electrode area, however, as the area being removed is relatively small, and because active layer electrical generation is also deleted at perforation sites, this is not assumed to be a major burden.

One effect of mechanical perforation such as punching or drilling may be the deflection or indentation of insulating substrate, structural substrate or other elements of the module. In many cases, such indentation may be desirable to module creation as it can offer a recessed perforation site having slightly improved protection from exterior wind that may deflect thermal boundary layers.

Integration of Thermally Improved Module Construction into Current Photovoltaic Cell Production Processes Because photovoltaic cell production is a highly sensitive and expensive process, and cell production is often pre-sold for considerable periods, it is not preferred to alter photovoltaic cell production in significant ways. The methods described herein need not be performed at the same location and/or time as the production of the photovoltaic cells themselves. Slight alterations of photovoltaic production processes, such as additional scribing of perforation site outlines are not considered significant.

It is preferable that that un-encapsulated photovoltaic cells are provided to manufacturers with strong expertise in the production and distribution of specialized building products, glazing units and the like and that most steps described herein are not typically performed in conjunction with production of photovoltaic cells.

The invention is not limited to the above description. Various modifications in the invention known to those of ordinary skill in the art should be construed as falling within the scope of the invention. Having described certain embodiments of the invention, it should be understood that the invention is not limited to the above description or the attached exemplary drawings. Rather, the scope of the invention is by the claims appearing hereinbelow and any equivalents thereof as would be appreciated by one of ordinary skill in the art.

What is claimed is:

1. A photovoltaic module having a front side exposable to the environment and a rear side comprising:
    an insulating substrate having first and second sides, said second side forming said rear side of said module;
    at least one photovoltaic solar cell layer having:
        at least one conducting electrode layer deposited on said first side of said insulating substrate;
        at least one semi-conducting active layer deposited on said at least one conducting layer; and
        at least one front conducting electrode layer deposited on said at least one semi-conducting active layer and said at least one conducting layer;
    at least one layer of photovoltaic cell protective encapsulant;
    at least one transparent front-sheet, and;
    a plurality of perforations formed entirely through said module extending entirely through said front side and entirely through said rear side, such that said perforations extend through said substrate, said active layer of said solar cell layer, said encapsulant layer, and said front-sheet, said perforations forming a ventilation mechanism allowing heat and air to be transferred from said front side of said module to said rear side of said module.

2. A photovoltaic module according to claim 1, further comprising a plurality of substantially tubular reinforcements disposed respectively within each of said perforations.

3. A photovoltaic module according to claim 2, wherein said tubular reinforcements are plastic, electrically insulating eyelets.

4. A photovoltaic module according to claim 1, wherein said module is adhered to a thermally conductive structural substrate having a second set of perforations at least through a contact surface between said substrate and said module, said second set of perforations in said structural substrate substantially corresponding to said perforations in said module.

5. A photovoltaic module according to claim 2, wherein said tubular reinforcements serve as additional mechanical attachment to a rear structural, thermally conductive substrate.

6. A photovoltaic module according to claim 1, wherein a surface area of said perforations is less than 5% of a surface area of said module.

7. A photovoltaic module according to claim 1, wherein a diameter of each of said perforations is less than 3 millimeters.

8. A method of manufacturing a photovoltaic module having a front side exposable to the environment and a rear side comprising the steps of:
    creation of at least one un-encapsulated solar photovoltaic cell, containing at least one insulating substrate layer having first and second sides, said second side forming said rear side of said module, one electrode layer and one semi-conducting semi-conducting layer;
    encapsulation of the cell with a protective frontsheet and at least one of a thermoset resin or an epoxy encapsulant, and;
    forming a ventilation mechanism allowing heat to be transferred in air from one side of the module to the other side of the module by forming a plurality of perforations entirely through said module extending entirely through said front side and entirely through said rear side, such that said perforations extend through said substrate layer, said semi-conducting active layer, said encapsulant, and said frontsheet.

9. A method according to claim 8, further comprising the step of forming perforation site voids each having a diameter greater than that of the ultimate module perforations, prior to module encapsulation.

10. A method according to claim 9, wherein said perforation site void forming step further comprises at least one of the following: scribing, etching or grooving by means used in forming solar cell interconnecting scribes by mechanical grinding, polishing or chemical etching.

11. A method according to claim 8, wherein module perforation is formed through, is of a diameter less than, and is centered at the core of solar cell through-hole conductive connection a.

12. A method according to claim 8, further comprising the step of forming a set of front panel inlets in a rear structural substrate or panel that substantially correspond to the module perforations.

13. A method according to claim 8, wherein said perforation forming step is performed prior to complete module encapsulant curing.

14. A method according to claim 8, further comprising the step of adding tubular reinforcements to each of the perforations formed in the module.

15. A method according to claim 14, wherein addition of perforation tubular reinforcements is performed prior to complete module encapsulant curing.

16. A structural, thermally optimized photovoltaic panel, comprising:
    a thermally conductive structural panel having a plurality of rear panel outlets; and front panel inlets;
    a photovoltaic module, having a first side exposable to the environment and a second side attached to said panel, said module including a) an insulating substrate, b) at least one photovoltaic solar cell having i) a conducting electrode layer deposited on said substrate, ii) a semi-conducting active layer deposited on said conducting electrode layer, and iii) a front conducting electrode layer deposited on said active layer, c) a layer of protective encapsulant disposed on said photovoltaic solar cell, and d) a transparent front-sheet, said module containing a plurality of perforations formed entirely through said module extending entirely through said first side and entirely through said second side, such that said perforations extend through said substrate, said active layer of said solar cell layer, said encapsulant layer, and said front-sheet, said perforations forming a ventilation mechanism allowing heat and air to be transferred from said first side of said module to said second side of said module,
    wherein said front panel inlets substantially correspond to said module perforations, and wherein heat from said module is transferred to said structural panel via at least convection through said ventilation mechanism, and said heat being further transferred from said panel to an airstream at the rear of said panel via at least said panel outlets.

17. A structural, thermally optimized photovoltaic panel according to claim 16, wherein said structural panel is adhered to said photovoltaic module with thermally conductive adhesive.

18. A structural, thermally optimized photovoltaic panel according to claim 17, wherein said structural panel comprises aluminum honeycomb paneling.

19. A structural, thermally optimized photovoltaic panel according to claim 17, wherein said panel is integrated as a building construction element, wherein heat and air transferred from said first side to said second side into a heated air stream is usable as pre-heated ventilation air, for relief of cavity overheating, to create buoyant chimney effect, to recharge dehumidification desiccant, and/or to pre-heat hot water via air-to-water coils for the building upon which said panel is disposed.

* * * * *